United States Patent
Udrea et al.

(10) Patent No.: US 12,294,356 B2
(45) Date of Patent: May 6, 2025

(54) MIXED MATERIAL POWER DEVICES AND DRIVER CIRCUITS

(71) Applicant: Cambridge GaN Devices Limited, Cambridge (GB)

(72) Inventors: Florin Udrea, Cambridge (GB); Philip Neaves, Cambridge (GB); Loizos Efthymiou, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 182 days.

(21) Appl. No.: 18/089,829

(22) Filed: Dec. 28, 2022

(65) Prior Publication Data

US 2024/0223182 A1 Jul. 4, 2024

(51) Int. Cl.
*H03K 17/14* (2006.01)
*H01L 27/06* (2006.01)
*H01L 29/778* (2006.01)

(52) U.S. Cl.
CPC ......... *H03K 17/14* (2013.01); *H01L 27/0605* (2013.01); *H01L 27/0623* (2013.01);
(Continued)

(58) Field of Classification Search
CPC .................................................. H03K 17/14
(Continued)

(56) References Cited

U.S. PATENT DOCUMENTS 9,748,949 B1 8/2017 Lu et al.
11,081,578 B2 8/2021 Udrea
(Continued)

OTHER PUBLICATIONS

Nagao Junichiro et al: "Monolithically Integrated Gate Driver for MHz Switching with an External Inductor as a Current Source", 2019 20th Workshop on Control and Modeling for Power Electronics (Compel), IEEE, Jun. 17, 2019, pp. 1-6, XP033581207, DOI: 10.1109/COMPEL.2019.8769614, retrieved on Jul. 22, 2019, abstract; figures 2, 3; table I, section I.
(Continued)

*Primary Examiner* — Tomi Skibinski
(74) *Attorney, Agent, or Firm* — Tarolli, Sundheim, Covell & Tummino LLP

(57) ABSTRACT

A power integrated circuit comprising: a heterojunction structure Gallium Nitride, GaN, chip comprising at least one GaN layer and at least one Aluminium Gallium Nitride, AlGaN, layer wherein the GaN chip comprises at least one main power device comprising a source terminal, a drain terminal, a gate terminal and a two-dimensional electron gas, 2DEG, formed at an interface between the AlGaN and GaN layers and between the source and drain terminals, wherein the gate terminal is configured to modulate at least a portion of the 2DEG when a charge is applied to the gate terminal, a driver comprising at least one low-side component and at least one high-side component, wherein the low-side component comprises a terminal connected to a low DC voltage rail and at least one other terminal connected to the gate terminal of the main power device; wherein the high-side component comprises at least one terminal connected to a high DC voltage rail and at least one other terminal connected to the gate of the main power device; wherein the at least one low-side component of the driver is configured to discharge an input capacitance of the main power device during a turn-off of the main power device and is monolithically integrated within the GaN chip; and wherein the at least one high-side component of the driver is configured to charge up the input capacitance of the main power device and is formed in a semiconductor region comprising a material other than GaN.

19 Claims, 12 Drawing Sheets

(52) U.S. Cl.
CPC .. *H01L 29/7786* (2013.01); *H03K 2217/0063* (2013.01); *H03K 2217/0072* (2013.01)

(58) Field of Classification Search
USPC ........................................................ 327/109
See application file for complete search history.

(56) References Cited

U.S. PATENT DOCUMENTS

| | | |
|---|---|---|
| 11,404,565 B2 | 8/2022 | Udrea |
| 2014/0028387 A1 | 1/2014 | Saunders |
| 2015/0115324 A1 | 4/2015 | Otremba et al. |
| 2018/0047719 A1* | 2/2018 | Vielemeyer .......... H01L 27/088 |

OTHER PUBLICATIONS

Moench Stefan et al: "Single-input GaN gate driver based on depletion-mode logic integrated with a 600 V GaN-on-Si power transistor", 2016 IEEE 4th Workshop on Wide Bandgap Power Devices and Applications (WIPDA), IEEE, Nov. 7, 2016, pp. 204-209, XP033029845, DOI: 10.1109/WIPDA.2016.7799938, retrieved on Dec. 27, 2016, abstract; figure 2; table I, section II.B, reference [6].

LU Search Report and Written Opinion for LU Application No. 503270, dated Jul. 6, 2023, pp. 1-16.

Jiang Wan Lin et al: "Monolithic Integration of a 5-MHz GaN Half-Bridge in a 200-V GaN-on-SOI Process: Programmable dv/dt Control and Floating High Voltage Level-Shifter", 2021 IEEE Applied Power Electronics Conference and Exposition (APEC), IEEE, Jun. 14, 2021, pp. 728-734, XP033944539, DOI: 10.'1109/APEC42165.2021.9487430, retrieved on Jul. 14, 2021, section I.

F. Udrea et al., "The smart ICeGaNTM platform with sensing and protection functions for both enhanced ease of use and gate reliability," 2022 IEEE 34th International Symposium on Power Semiconductor Devices and ICs (ISPSD), 2022, pp. 41-44, doi: 10.1109/ISPSD49238.2022.9813659.

L. Efthymiou, M. Arnold, G. Longobardi and F. Udrea, "A novel depletion mode p-GaN island HEMT and its use in a monolithically integrated start-up circuit," ESSDERC 2022—IEEE 52nd European Solid-State Device Research Conference (ESSDERC), 2022, pp. 396-399, doi: 10.1109/ESSDERC55479.2022.9947100.

* cited by examiner

MIXED MATERIAL POWER DEVICES AND DRIVER CIRCUITS

FIELD OF THE DISCLOSURE

The present disclosure relates to power semiconductor devices and driver circuit. Particularly, but not exclusively, the disclosure relates to the use of a hetero-structure AlGaN/GaN high electron mobility transistor and a silicon companion chip.

BACKGROUND OF THE DISCLOSURE

Gallium Nitride (GaN) is a wide band gap material suitable for power and RF semiconductor devices. GaN technology allows the design of transistors with high electron mobility and a high saturation velocity, both of which are, generally, useful traits in the field of power and Radio-Frequency (RF) electronics. The use of GaN material has additional advantages in power devices. For example, the wide band gap of the material ($E_g$=3.39 eV) results in high critical electric field ($E_c$=3.3 MV/cm), which can allow the design of devices with a shorter drift region (and therefore a lower on-state resistance) compared to silicon-based devices with the same breakdown voltage.

The use of an Aluminium Galium Nitride (AlGaN)/GaN heterostructure also allows the formation of a two-dimensional electron gas (2DEG) at the hetero-interface where carriers can reach very high carrier mobility values (e.g. $\mu$=2000 cm$^2$/(Vs)). In addition, the piezopolarization charge present at the AlGaN/GaN heterostructure can result in a high electron density in the 2DEG layer (e.g. $1e^{13}$ cm$^2$). These properties allow the development of High Electron Mobility Transistors (HEMTs) and Schottky barrier diodes with very competitive performance parameters. An extensive amount of research has focused on the development of power devices using AlGaN/GaN heterostructures, resulting in several technologies that enable normally on (Schottky gate based technology) and normally off (insulated gate and p-GaN gate technology) HEMT devices. It will be understood that normally off devices may also be referred to as enhancement mode devices, while normally on devices may also be referred to as depletion mode devices.

A gate driver is an interface circuit between a power device and a controller. It takes a low-power input from a controller integrated circuit (IC) e.g. in a form of a pulse width modulation (PWM) and it outputs an appropriate signal to charge or discharge the gate of the power device in order to switch the power device on or switch the power device off. In general, the gate of a power device cannot be directly driven with a PWM signal from the controller because of its low current capability. The gate driver therefore should be able to deliver an appropriate current to charge the input capacitance of the power device to turn the device on and to discharge this capacitance to turn the device off.

Totem-Pole type drivers (e.g. schematically shown in FIG. 1) built in silicon feature pnp and npn complementary transistors. The npn transistor (as a high-side component) has its collector connected to a high-voltage DC rail and the pnp transistor (as a low-side component) has its collector connected to a low-voltage DC rail. The terms "high-side" and "low-side" used herein refer generally to different parts of a driver circuit. The high-side is the part of the circuit that is connected to the high positive DC rail and is responsible for driving the power device during turn-on. The low-side is the part of the circuit that is connected to the ground (or lower potential DC rail) and is responsible for driving the power device during the turn-off. The emitters of the two transistors can be connected together and through a resistor to the gate of the power device. This configuration also provides a good clamping of the gate to a voltage that equates VDD+VBE where VBE is the base-emitter voltage of the npn transistor. In particular for some GaN power devices that have a sensitive gate (limited voltage that can be applied to the gate) this is a beneficial feature. The extra gate resistance is often introduced to adjust the dV/dt slopes during turn-on and turn-off. Alternatively, the emitters of the two transistors can be connected through different resistor paths to the gate so that the dV/dt slopes can be adjusted independently during turn-on and turn-off. Ideally the npn and pnp transistors are operated in saturation so that the voltage drops across their collector-emitter terminals is very low. However often bipolar transistors need relatively high base currents to operate in saturation (for minimum voltage drops between their collector and emitter terminals) and the pnp transistor, in particular, tends to be slower and is limited by a relatively high voltage drop in saturation for a given chip area. A bypass capacitor between VDD and ground is also provided. This capacitor is charged to VDD and provides the gate current during the turn-on of the power device.

An alternative solution is to use two NPN transistors, wherein the pnp transistor mentioned above is replaced by an npn transistor with an extra inverter attached to its base.

Double stage CMOS inverter configurations are also known in prior art where the second inverter stage is made of several parallel inverter chips (FIG. 2).

The second inverter stage (202, 203, 204) (with the output connected to the gate of the power device) could be replaced with a larger area (higher current) single inverter which would have equivalent currents to the parallel configuration. This second stage could comprise an n-channel MOSFET device in the low-side which is responsible for the turn-off discharging path of the input capacitance of the power device and a p-channel MOSFET device for the turn-on charging path of the input capacitance of the power device. The on-state resistances of both the n-channel and p-channel MOSFETs are desirably as low as possible to speed up the turn-on and turn-off charging and discharging of the gate.

A configuration involving a monolithic integration of the driver and the power device is attractive as it results in a reduced component count, and reduced parasitics (inductances, capacitances, resistances) between the driver and the power device. This is particularly desirable if the power integrated circuit is to be operated at high frequencies. Given their low intrinsic parasitic capacitances, GaN power devices can indeed operate at higher frequencies than equivalent silicon devices and therefore a monolithically integrated solution is desirable. Moreover, the integrated solution can also help reducing dV/dt and dI/dt effects by cutting parasitics (such as parasitic inductances) between the power device and the driver.

However, integrating a full driver in GaN also has some disadvantages, In GaN technology there are no npn or pnp transistors available and the development on p-channel unipolar transistors is at a very incipient stage. Such p-channels operating with two-dimensional hole gas (2DHG) have poor performance because of the very low hole mobility.

Moreover, due to the absence of CMOS architecture in GaN (on account of the absence of p-channel devices) the power consumption of a monolithically integrated driver in GaN (especially in standby condition) cannot be ignored. Furthermore, integrating the full driver and the power device within the same chip can lead to some undesirable heat coupling between the two, further deteriorating the driver performance.

Given the problems described above, an improved architecture is desired.

The following documents could be considered as known art:

[1] F. Udrea et al., "The smart ICeGaN™ platform with sensing and protection functions for both enhanced ease of use and gate reliability," 2022 IEEE 34th International Symposium on Power Semiconductor Devices and ICs (ISPSD), 2022, pp. 41-44, doi: 10.1109/ISPSD49238.2022.9813659;

[2] L. Efthymiou, M. Arnold, G. Longobardi and F. Udrea, "A novel depletion mode p-GaN island HEMT and its use in a monolithically integrated start-up circuit," ESSDERC 2022—IEEE 52$^{nd}$ European Solid-State Device Research Conference (ESSDERC), 2022, pp. 396-399, doi: 10.1109/ESSDERC55479.2022.9947100;

[3] U.S. Ser. No. 11/081,578;

[4] U.S. Ser. No. 11/404,565.

SUMMARY

In general terms, it is an object of this invention to provide an improved architecture between the power device and the driver to address the above described problems.

According to a first aspect of this invention there is provided a power integrated circuit comprising a heterojunction structure Gallium Nitride, GaN, chip comprising at least one GaN layer and at least one Aluminium Gallium Nitride, AlGaN, layer wherein the GaN chip comprises at least one main power device comprising a source terminal, a drain terminal, a gate terminal and a two-dimensional electron gas, 2DEG, formed at an interface between the AlGaN and GaN layers and between the source and drain terminals, wherein the gate terminal is configured to modulate at least a portion of the 2DEG when a charge is applied to the gate terminal. A driver comprises at least one low-side component and at least one high-side component, wherein the low-side component comprises a terminal connected to a low DC voltage rail and at least one other terminal connected to the gate terminal of the main power device; wherein the high-side component comprises at least one terminal connected to a high DC voltage rail and at least one other terminal connected to the gate of the main power device. The at least one low-side component of the driver is configured to discharge an input capacitance of the main power device during a turn-off of the main power device and is monolithically integrated within the GaN chip. The at least one high-side component of the driver is configured to charge up the input capacitance of the main power device and is formed in a semiconductor region comprising a material other than GaN.

Optionally, the at least one other terminal of the high-side component connected to the gate of the main power device is connected directly to the gate of the main power device.

Optionally, the at least one other terminal of the high-side component of the driver connected to the gate of the main power device is connected indirectly to the gate of the main power device through a diode and/or a resistor.

Preferably, the main power device and/or the low-side component of the driver is a High Electron Mobility Transistor (HEMT), and wherein the main power device has a higher power output and a higher blocking voltage than the low-side component of the driver.

Optionally, the main power device and/or the low-side component of the driver comprises a plurality of 2DEG channels arranged in parallel between the source and drain terminals of the main power device.

Optionally, the low-side component of the driver comprises one of: a HEMT, MOSFET or MISFET, operative as a Miller clamp with a drain terminal connected to the gate terminal of the main power device and a source connected to the source of the main power device, and wherein the low-side component can be arranged proximal to the main power device or within a structure of the main power device. Preferably, the low-side component of the driver is a HEMT and can use similar layers to the main power device for ease of fabrication.

Optionally, the at least low-side component of the driver comprises a normally-on or normally-off transistor or a parallel combination of a normally-on and normally-off transistor.

Optionally, the low-side component is configured to provide an increased resistance when the low-side component is in an OFF state and a reduced resistance when the low-side component is in the ON-state.

Optionally, the low-side component of the driver comprises said HEMT, the HEMT comprising multiple p+ GaN islands displaced in a dimension perpendicular to the current flow, where all the p+ islands are connected to a gate terminal. By p+GaN we mean here a layer of Gallium Nitride that is highly doped with acceptor type dopants (such as Magnesium). For example a concentration of at least $1e^{19}$ cm$^{-3}$ would be considered an appropriately high level of doping.

Optionally, the GaN chip comprises one or more further 2DEG low-power transistors connected to the main power device or the low-side component of the driver.

Optionally, the at least one high-side component is configured as a hole conduction component.

Optionally, the at least one high-side component is provided in a first semiconductor material, the at least one low-side component is provided in a second semiconductor material, and wherein the first semiconductor material and the second semiconductor material are different semiconductor materials.

Optionally, the at least one high-side component and the at least one low-side component operate as a CMOS cell.

Optionally, a further low-side component of the driver is arranged in parallel with the at least one low-side component of the driver and provided in the semiconductor region comprising a material (first semiconductor) other than GaN.

Optionally, the further low-side component comprises an n-channel MOSFET, an n-channel JFET or a PNP bipolar transistor or an NPN transistor with an additional inverter driving its base.

According to further implementation of the present disclosure, there is provided a power integrated circuit (Power IC) comprising: a Gallium Nitride chip (GaN chip) based on a heterojunction structure comprising at least one Gallium-Nitride (GaN) layer and at least one Aluminium Gallium Nitride (AlGaN) layer. The GaN chip contains at least one main power device comprising a source terminal, a drain terminal and a gate terminal and a two-dimensional electron gas (2DEG) formed at an interface between an AlGaN and GaN layers and is placed between the source and drain terminals, wherein at least a portion of the 2DEG layer is modulated by the charge applied to the gate terminal. A driver is provided containing at least one low-side component and at least one high side component, where the low-side component has one terminal connected to a low DC voltage rail (e.g. ground) and at least one other terminal connected to the gate of the main power device, The high side component has at least one terminal connected to a high DC voltage (e.g. VDD) and at least one other terminal connected directly to the gate of the main power device or indirectly through a diode and/or a resistor to the gate terminal of the main power device. The at least one low-side component of the driver is responsible to discharge the input capacitance of the main power device during the turn-off of the main power device and is monolithically integrated within the GaN chip. The at least one high side component of the driver is responsible for charging up the input capacitance of the main power device and is incorporated in a different semiconductor region based on a different material, other than GaN.

The main power device could be a HEMT (High Electron mobility Transistor) and could feature a two dimensional gas (2DEG) at the heterojunction interface between an AlGaN layer and a GaN layer, placed between the source and drain terminals. It could be a normally off device or a normally on device. It could feature a p-type GaN gate (made for example of Magnesium) to modulate the 2DEG channel in a region between a source and a drain terminal. An ohmic or Schottky metal could be placed on top of the p-type gate to form the gate terminal. Alternatively, it could feature an insulated gate or a Schottky gate. The main power device can incorporate several fingers or cells to scale up the current capability.

The main power device could feature multiple 2DEG channels formed between subsequent layers of GaN and AlGaN. The multiple 2DEG layers help to reduce the on-state resistance between the source and drain terminals when the device is in the on-state. The multiple channel HEMT could feature a tri-gate or FinFET structure to control the channels or could be based on a CASCODE configuration.

The at least one low-side component of the driver may be a HEMT device featuring a 2DEG and operating similarly to a Miller clamp. Its drain terminal is connected to the gate terminal of the GaN power device and its source could be connected to the source of the main power device. The at least one low-side component (Miller clamp) is integrated within the GaN chip and can sit alongside or next or even within the main power device (FIG. 4). The at least one low-side component (the low-side HEMT) has lower on-state current and lower blocking voltage capability than the power device. The term blocking voltage as used herein is the voltage that can be applied across the drain-to-source terminals of the component before it starts to conduct, due to a breakdown mechanism or due to a high increase in the leakage current It is also referred to as the breakdown voltage or the avalanche voltage. It is the maximum voltage that can be applied across the component, beyond which it will start to conduct and allow current to flow even though the device is biased in the off-state mode of operation. In some cases, breakdown voltage may refer to a voltage which causes the device to fail open (i.e. the device can no longer conduct current when subsequently biased in the on-state mode of operation).

Alternatively, the at least one low-side component of the driver could be a n-channel MOSFET or MISFET using a classical insulated gate and a surface channel and monolithically integrated in the GaN chip.

The low-side component of the driver could be a normally-off or a normally-on device or a parallel combination between a normally-on device and a normally-off device. The low-side component of the driver could be a low-side HEMT made in the same process steps and using similar layers as the main power device, therefore not adding any complexity to the process flow. The low-side HEMT could be a lower-voltage and lower-power device than the main GaN power device. Its size could be significantly smaller than that of the main power device. The low-side HEMT (low-side component of the driver) could be self-isolated from the main power device. Alternatively, the main power device and the low-side HEMT could sit in two different locations of the active area with an isolation provided between them.

If the main power device is formed using multiple 2DEG channels, it is preferable for the low-side component (the low side HEMT) also to use multiple channels with a similar gate architecture to that of the main power device. Alternatively, the low-side component of the gate driver (the Miller clamp) could feature a single 2DEG channel while the multiple power device could feature multiple 2DEG channels.

The low-side HEMT device could be based or incorporate a p+ island design as described in U.S. patent Ser. Nos. 11/081,578, 11/404,565 and F. Udrea et al. [1] and L. Efthymiou et al. [2].

The driver could incorporate other components and logic blocks. The driver could for example incorporate a first inverter stage in series with a second inverter stage where the second inverter stage could comprise the said at least one low-side component and the said at least one high-side component. The first inverter stage could be driven by a PWM signal from the controller while the second inverter stage may have one or multiple output connected directly or indirectly (through resistors and/or diodes) to the gate terminal of the main power device. The driver could also incorporate one or multiple bypass capacitors, diodes (such as Schottky or Zener) for clamping and protection purposes or multiple DC rails for biasing.

A further low side component of the first inverter stage could also be monolithically integrated within the GaN chip in the form of a further lower-power HEMT (FIG. 5). The drain and the source of the further lower-power HEMT could be connected to the gate and the source respectively of the at least one low-side component of the second stage of the driver. The further low-power HEMT could have lower power and possibly lower blocking voltage capability than the low-power component of the driver. The further lower-power HEMT could be part of the first inverter stage of the driver and connected to the PWM signal.

The first inverter stage could also incorporate a further high side p-channel device (using hole conduction). The further high-side p-channel device could have lower power than the high-side p-channel device of the second inverter stage.

Alternatively, the further low side component of the first inverter stage could be incorporated within a different semiconductor region, based on a different material, other than GaN.

Furthermore, any logic or low-power components (part of the driver or controller or sensing and protection circuits) or components which are formed with an n-channel (i.e. they feature electron conduction) or play the role of a low-side device, could be monolithically integrated within the GaN chip in the form of low-power HEMTs and taking advantage of the high electron mobility of the 2DEG channel the and high performance of the HEMT which includes low on-state resistance and low parasitic capacitances. Alternatively, except for the at least one low-side component of the drive (Miller clamp), for matching purposes or for the need of local integration of CMOS circuits or for the need of using bipolar transistors such low-power n-channel components, low-side components can be incorporated within the different semiconductor region based on a different material, other than GaN.

Further, at least one high-side component and any other component featuring p-channel device, (using hole conduction rather than electron conduction) or any component featuring npn or pnp transistors can be incorporated within the different semiconductor region based on a different material, other than GaN.

FIG. 6 shows an NPN transistor (incorporated in a different semiconductor region based on a different material, other than GaN) featuring on the high-side of the driver while on the low side of the driver a low-power HEMT in monolithically integrated with the main power device. In this figure the first stage of the inverter showing n-channel and p-channel MOSFETs in a CMOS configuration is shown implemented in the silicon chip.

Optionally a further low-side component (of the second stage) could be configured in parallel with the at least one low-side component (the Miller clamp) and placed within the said different semiconductor region based on a different material, other than GaN. This component could be for example an n-channel MOSFET, an n-channel JFET or a PNP transistor (FIG. 7a) or a NPN transistor with an additional inverter placed in its base (FIG. 7b). The role of this further low-side component of the driver is to aid the discharging of the input capacitance during the turn-off and thus providing a parallel path for the transient current flow during the turn-off off the main power device. If, for example, a PNP transistor is added, the parallel combination between the PNP transistor different semiconductor region based on a different material, other than GaN and the low-side component of the driver incorporated in the GaN chip (Miller clamp) could be more stable at elevated temperatures. On one hand, bipolar devices made in GaN such as the HEMT are known to have a significant increase in the on-state resistance at higher temperatures, due to the decrease in the channel mobility (2DEG mobility) at high temperatures. On the other hand, the base-emitter junction voltage reduces at high temperature and the injection of carriers is increased at high temperatures. As a result, a parallel combination between the low-side GaN HEMT and a low-side PNP transistor made in different semiconductor material could offer a more stable operation in temperature. The same argument applies if instead of a PNP transistor, an NPN transistor with an additional inverter in its base is used. The use of a further low-side component of the driver could be advantageous to absorb more efficiently higher dV/dt currents and thus increase immunity against dV/dt.

The said different semiconductor region based on a different material, other than GaN could be part of a silicon companion chip. The silicon chip can optionally (and preferably) sit close to the GaN chip and preferably inside the same package or module. Both the silicon and the GaN chips can have a lateral configuration, thus allowing for a simple die to die bonding. Thus, the two chips (GaN and Si) can be integrated in a hybrid mode within the same package or module.

An advantage of having a silicon companion chip, is that the at least one high-side component of the driver could be made of p-channel MOSFETs or an npn bipolar transistors. They could be made in a mature Silicon process (e.g. 0.35 um, 0.18. 0.13 um nodes) with good performance. Such transistors (i.e. p channel or bipolar) either do not exist or have very low performance when made in Gallium Nitride. The silicon companion chip could be made for example in a CMOS process, or a bipolar process or a CMOS-bipolar proves or a Bipolar-CMOS-DMOS (BCD) process or a high voltage CMOS process.

Moreover, the p-channel high-side component in Silicon (e.g. MOSFET) together with the n-channel low-side component in GaN (HEMT) could form an efficient CMOS-type cell which allows for low power consumption (virtually zero in steady-state and relatively small in transient) and optimised area consumption.

Furthermore, the n-channel low-side component in GaN (HEMT) could sit very closely to the main power device thus cutting undesirable parasitics (especially inductances) between its drain terminal and the gate of the main power device. This could help with tolerating higher dV/dt and dI/dt signals during switching. Given the high mobility of the HEMT (>1600 $cm^2/(Vs)$) and its low parasitic capacitances, such device could potentially have higher performance or could occupy a smaller area than an equivalent n-channel transistor integrated in silicon. As already mentioned, its position in the close proximity of the power device is of high importance as it acts to discharge fast the input capacitance during the turn-off and minimises gate signal oscillations. The term proximal or in close proximity as used herein means near. In this context, it means that the low-side component can be positioned either very close to the main power device or within the structure of the main power device.

The low-side component in GaN (HEMT) could be ON in a high resistance mode (kohm range) when the main power device is in the on state or during active reverse conduction and fully ON in a low resistance mode (ohm range) during the turn-off of the main power device or in the off-state or during reverse conduction.

The said different semiconductor region based on a different material, other than GaN could be part of the substrate, physically below (or adjacent and below) the GaN and AlGaN layers (FIG. 8). This allows for a high level of integration and a very compact solution. Access to the substrate could be made by etching through the GaN layers placed on the top. The transistors in the substrate could be made by etching through the GaN layers and using typical techniques such as implants, oxidation or deposition of oxide layers to form transistors.

The substrate could be made of Silicon or Silicon Carbide. Silicon Carbide is more expensive than silicon but offers higher breakdown field and better match with the GaN/AlGaN layers placed above. Additionally, the presence of SiC, would allow thinner layers of GaN to be grown above the SiC substrate. Nevertheless, the channel mobility of p-channel transistor made in silicon is higher than those of equivalent p-channel transistors made in Silicon Carbide.

In a further implementation of the present disclosure (FIG. 9), the power integrated circuit comprises: a half bridge circuit containing a low-side main power device within a GaN chip, a high-side main power device placed within the GaN chip or a further GaN chip. A driver is provided containing a first pair and a second pair, each pair containing at least one low-side component, at least one high side component, wherein the first pair is configured to charge and discharge the input capacitance of the low-side main power device during the turn-on and turn-off of the low-side main power device and wherein the second pair is configured to charge and discharge the input capacitance of the high-side main power device during the turn-on and turn-off of the low-side main power device. The driver further comprises a level shifter which shifts the low voltage control of the first pair to a high voltage control of the second pair.

Each of the at least one low-side component of the driver is within the GaN chip or in the further GaN chip. Finally, each of the at least one high-side components of the driver are incorporated in a different semiconductor region based on a different material, other than GaN.

As already described above, the different semiconductor region based on a different material, other than GaN could be part of a Silicon companion chip or could be part of the Silicon substrate or a silicon Carbide substrate.

The level shifter could also be part of the Silicon companion chip (or could be part of the Silicon substrate or a silicon Carbide substrate) or elements of it could be placed in the silicon chip and other elements could be placed in the GaN chip or the further GaN chip.

Isolation regions made with optical, capacitive and inductive (magnetic) elements could be provided between the logic signal (PWM) from the controller to the input driver. For example an opto-coupler featuring an LED and a photo-diode could be used for isolation.

The half bridge containing the two main power devices could be integrated into a single GaN chip. This would be preferable for reducing the number of components and reducing complexity or cost. However, integrating a low side high voltage device with a high-side high voltage device poses significant challenges in terms of voltage cross-talk and isolation. For this reason, the two main power devices may sit in separate chips, each having a different substrate.

Each of the main power device can feature a low-side component of the drives based on a 2DEG and operating similarly to a Miller clamp. The high side components of the driver (e.g. p-channel MOSFETs or bipolar transistors) can sit in a in a different semiconductor region based on a different material, other than GaN. The high side components may have different DC rail voltages (level shifted from each other).

In a further implementation of the present disclosure (FIG. 11) there is provided a power integrated circuit comprising: multiple GaN chips, each GaN chip featuring a main power device and a low-side component of the driver (Miller clamp); wherein all the main power devices are connected in parallel to deliver higher output current and/or smaller on-state resistance, and a single Silicon companion chip featuring at least one high-side component of the driver, where the at least one-high side component of the driver is connected directly (or indirectly through resistances and/or diodes) to all the drain terminals of the low-side component of the drivers and further connected to the gate terminals of the main power devices.

In this implementation, instead of having one silicon companion chip for each of the GaN chips, there is provided a single companion chip for multiple GaN chips placed in parallel. This is advantageous as it reduces the BOM and it provides a more effective solution from an assembly and cost perspective.

The Silicon companion chip described above could additionally incorporate any of the circuit blocks below:
Level shifter (to shift the signals for high side power devices)
Logic circuits (inverters, gates)
PWM controller
Voltage regulators (to adapt a wide range of rail voltages)
Start-up circuits (to provide a DC voltage from a high voltage rail)
Bandgap reference (to provide reference voltage stable in temperature)
Current sensing or current amplifiers or transconductance circuits (to provide current sensing or facilitate current sensing or amplify signals from a current sense device)
Temperature sensing (using for example VPTAT circuits)
Over current and over temperature protection circuits
Memory storage (for example for calibration purposes)
Undervoltage lock-out circuits
Slew rate control circuits
ESD protection devices The GaN chip described above could additionally incorporate current sensing devices or high voltage current sensing switches used to facilitate current sensing.

In this disclosure, unless explicitly specified, the heterojunction transistors may be any known transistor based on a heterojunction such as a p-Gate HEMT transistor, or a Schottky gate transistor or an insulated gate transistor such as MISFET (Metal Insulating Semiconductor Field Effect Transistor). The diodes can be Schottky diodes, Zener diodes or pn diodes or diodes made of a transistor by connecting the gate terminal with any of its other terminals. The GaN chip could be a heterojunction chip or incorporate a heterojunction power device. It could be referred to as a heterojunction smart power device or heterojunction smart chip or heterojunction power integrated circuit or heterojunction integrated circuit.

The power IC could incorporate in a single package or single module the GaN chip or multiple GaN chips and a silicon companion chip.

BRIEF DESCRIPTION OF THE DRAWINGS

These and other aspects will now be described in which.

DETAILED DESCRIPTION

Figure 1:
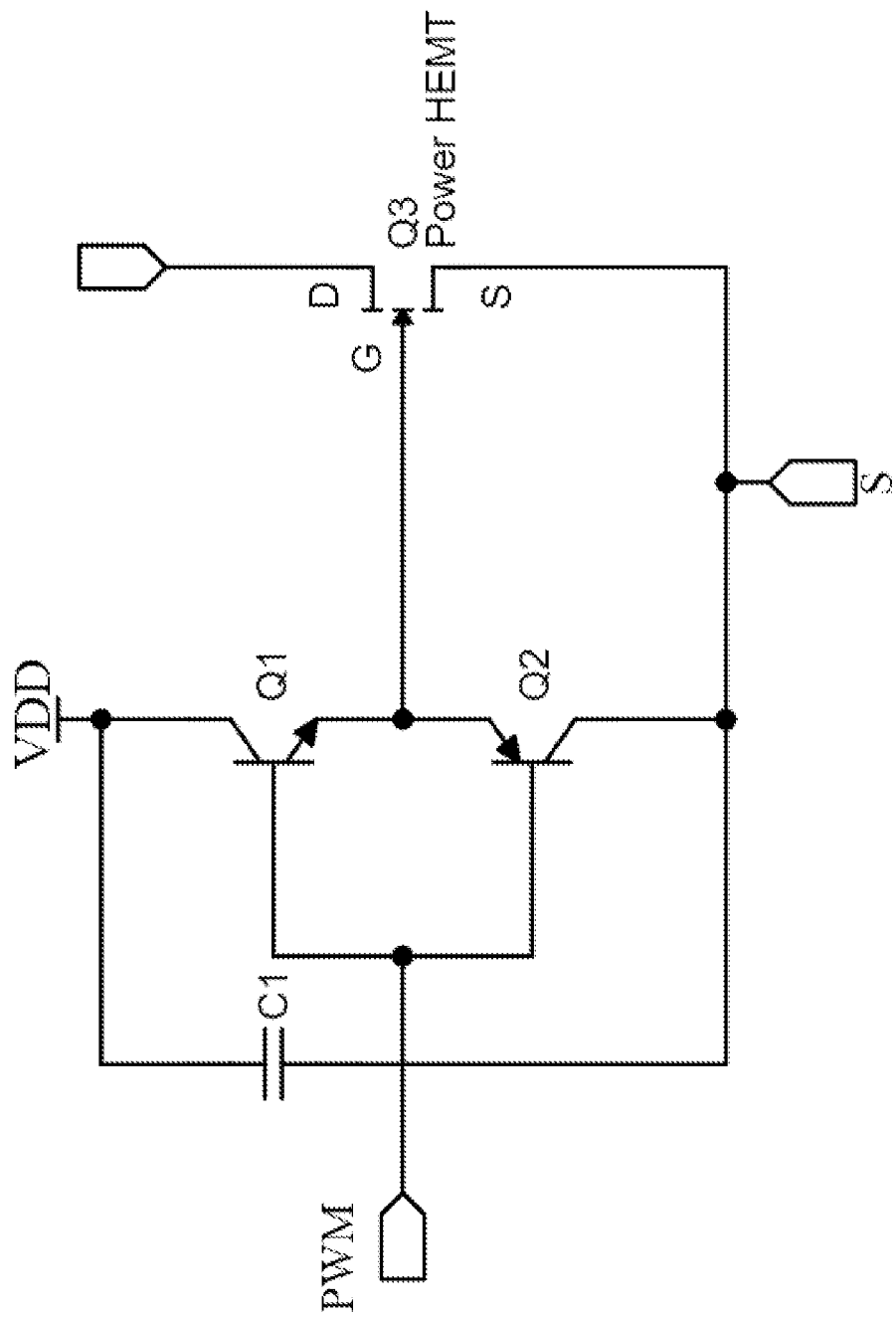
FIG. 1 illustratively shows a schematic diagram of a known Totem-Pole type driver.

FIG. 1 illustrates a schematic diagram of a Totem-Pole type driver in prior art. The Totem-Pole type driver illustrated comprises pnp and npn complementary transistors. The npn transistor Q1 (as a high-side component) has its collector connected to a high DC rail VDD and the pnp transistor Q2 (as a low-side component) has its collector connected to a low-voltage DC rail. In the example illustrated in FIG. 1, the collector of the pnp transistor is connected to the source terminal of the power device Q3. The emitters of the two transistors can be connected together and optionally through a resistor (not illustrated here) to the gate of the power device.

Figure 2:
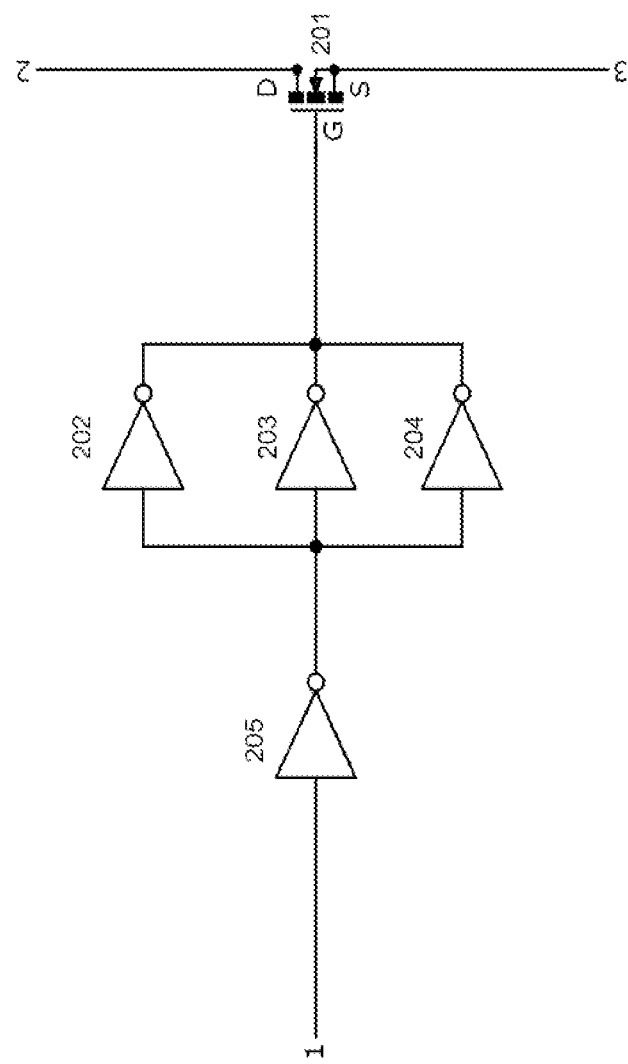
FIG. 2 illustratively shows a schematic diagram of a known double stage CMOS inverter type driver'.

FIG. 2 illustrates a schematic diagram of a double stage CMOS inverter type driver which is known in prior art. The driver comprises a CMOS inverter as the first stage. In the example illustrated, the second inverter stage comprises three parallel inverters. Fewer or more inverters may be used in parallel. The output of the second stage is connected to the gate of the power device optionally through a resistor (not illustrated here).

Figure 3:
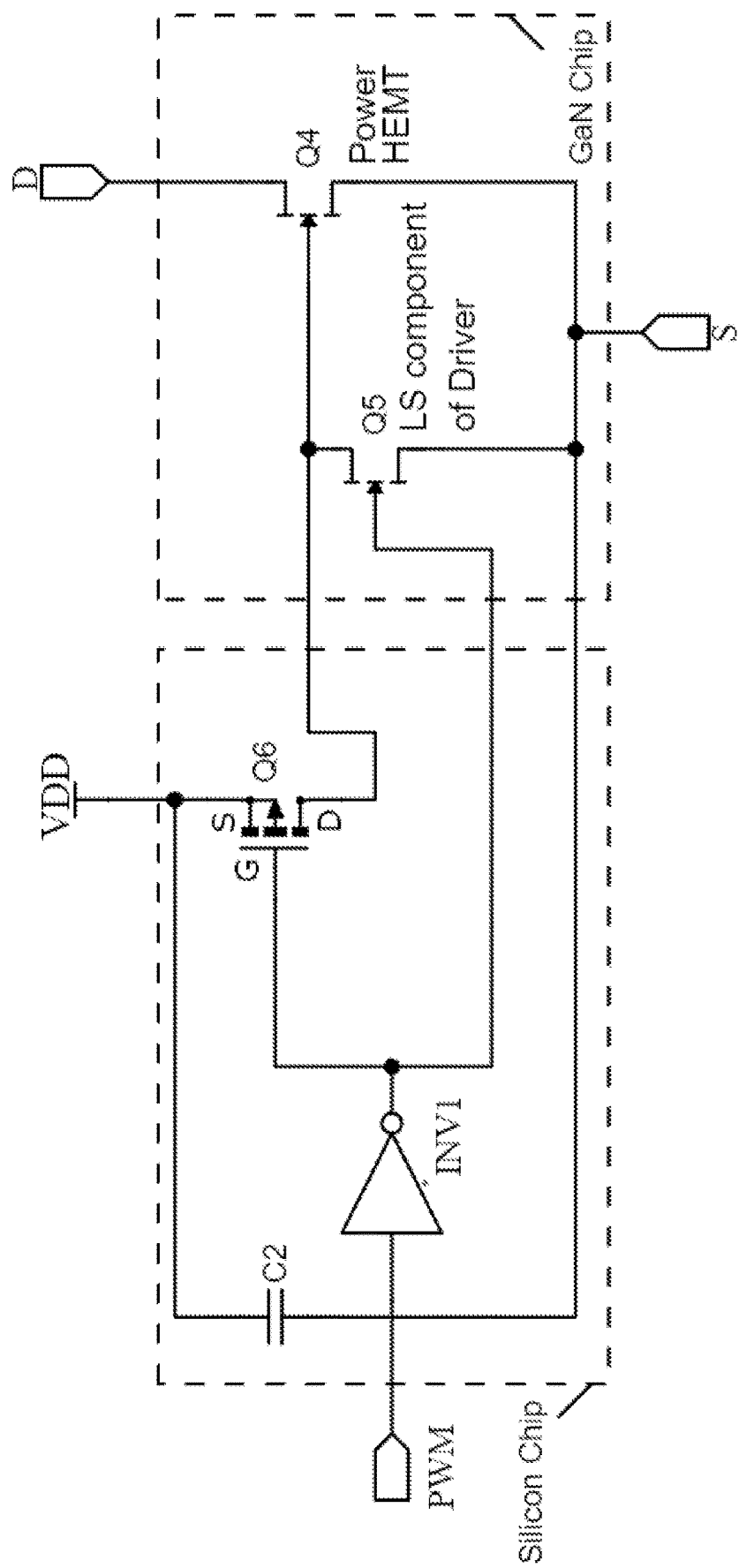
FIG. 3 illustratively shows a schematic diagram of a gate driver and main power device according to the present disclosure.

FIG. 3 illustrates a schematic diagram of a gate driver and main power device wherein the gate driver is partly built in Silicon and partly built in GaN. The main power device Q4 in this embodiment is built in GaN. In the example illustrated in FIG. 3, the part of the gate driver built in Silicon is a CMOS inverter INV1 and a high side device Q6, where the high side device is a p-channel MOSFET. The part of the gate driver built in GaN is a low side device Q5, where the low side device in this example is a GaN HEMT.

Figure 4:
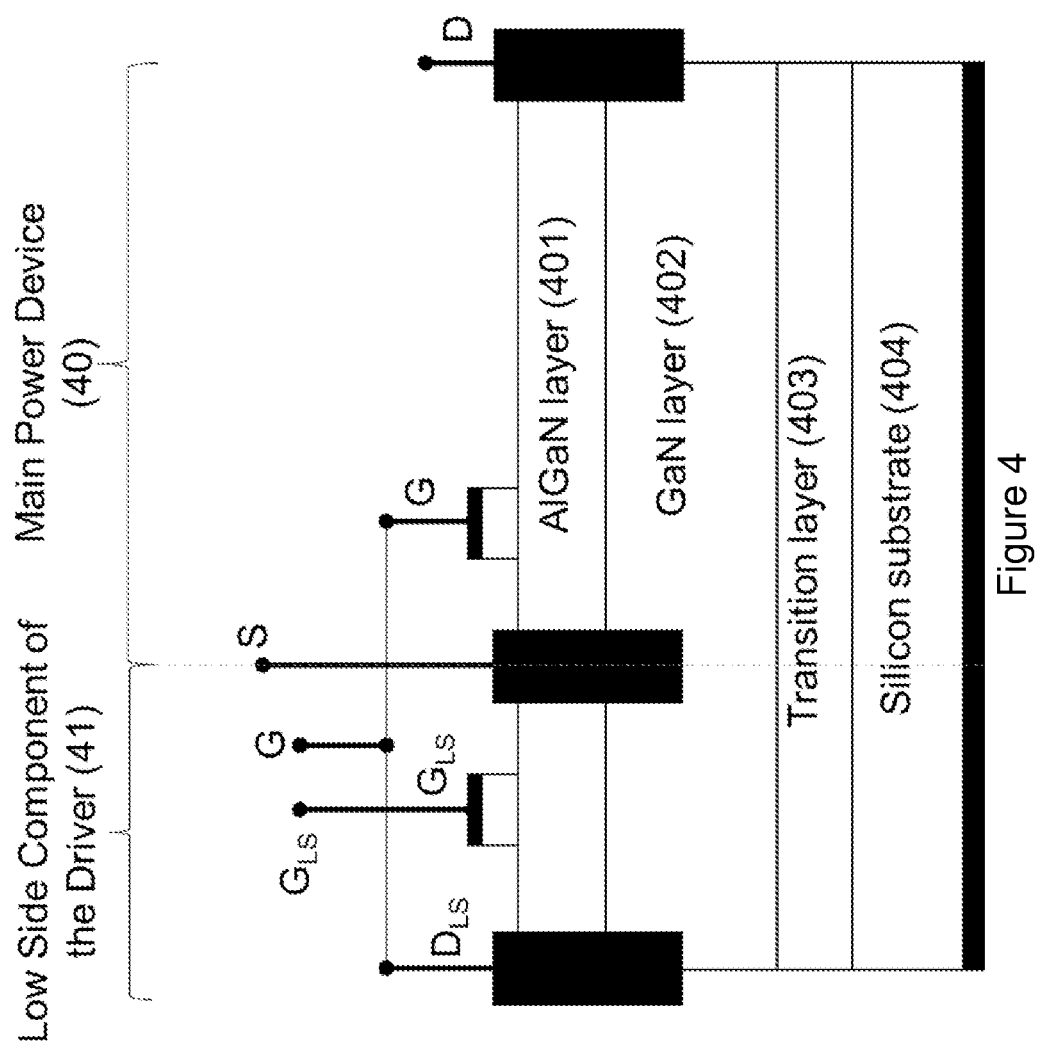
FIG. 4 illustratively shows schematic cross section of an example of the components built in GaN as illustrated in FIG. 3.

FIG. 4 illustrates a schematic cross section of an example of the components built in GaN as illustrated in FIG. 3. The cross section illustrates a substrate and an epitaxial stack which comprises a Silicon substrate 404, a transition layer 403, a GaN layer 402 and an AlGaN layer 401. Two devices are built on this material, one is the main power HEMT 40 and one is the low side device of the gate driver 41. Both devices are three terminal devices comprising a drain contact, a source contact and a gate contact. Both devices illustrated comprise a p-GaN gate. The main power HEMT 40 may be a higher voltage rating device than the gate drive low side device 41 as illustrated by the longer drift region (i.e. drain contact to gate contact separation) of the main power HEMT. The electrical connections between the gate driver device and main power HEMT, as illustrated in FIG. 3, may be made using track metals.

Figure 5:
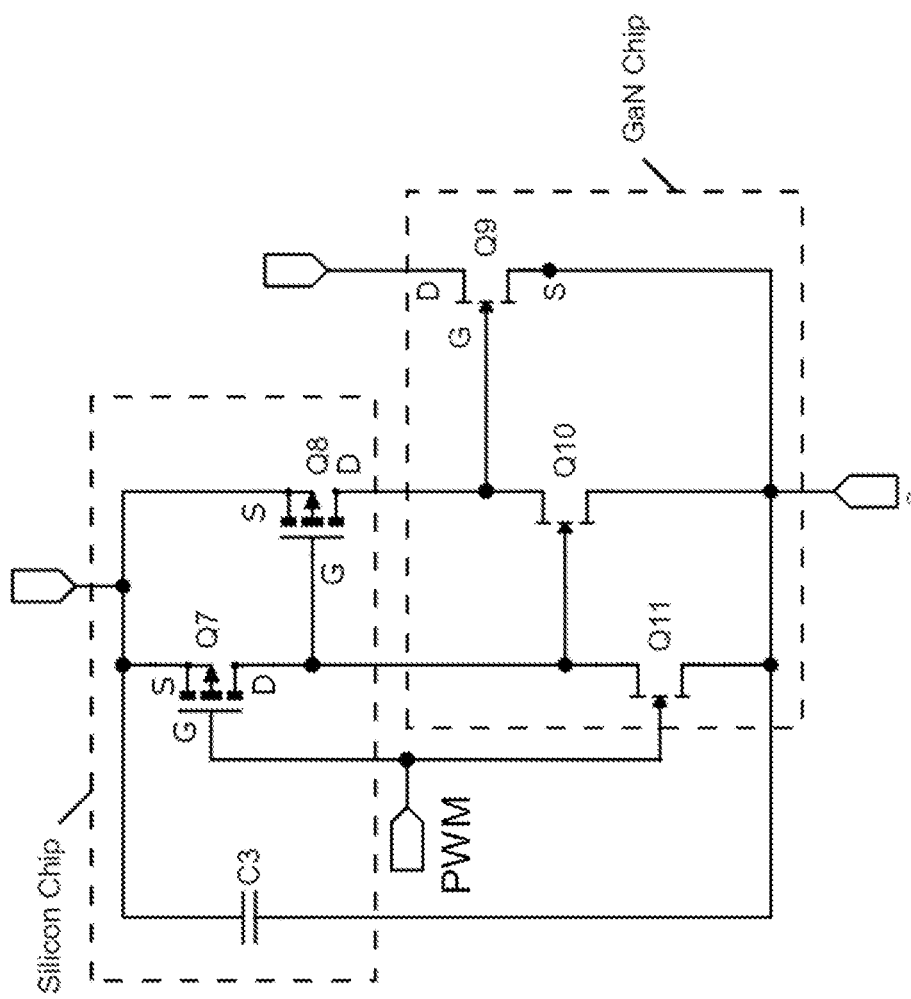
FIG. 5 illustratively shows a schematic diagram of an additional example of a gate driver and main power device according to the present disclosure wherein the gate driver is partly built in Silicon and partly built in GaN.

FIG. 5 illustrates a schematic diagram of an additional example of a gate driver and main power device wherein the gate driver is partly built in Silicon and partly built in GaN. In this example, and similar to previous examples, the main power HEMT Q9 and at least one gate driver low side device Q10 are built in GaN. However, in this example, an additional low side device Q11 is built in GaN where the additional low side device may also be a GaN HEMT. All gate driver high side devices (Q7 and Q8) in the example illustrated in FIG. 5 are built in Silicon and may be p-channel MOSFETs.

Figure 6:
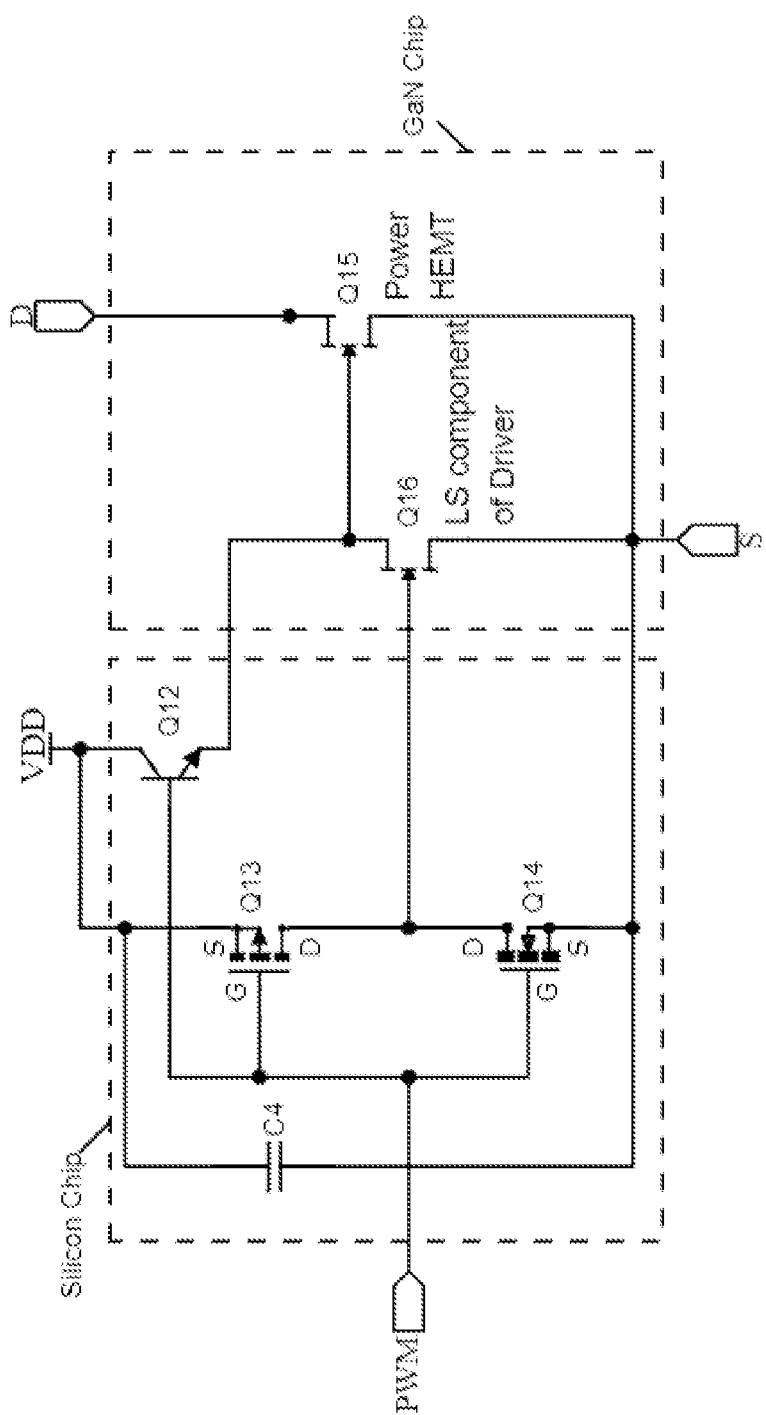
FIG. 6 illustratively shows a schematic diagram of an additional example of a gate driver and main power device according to the present disclosure wherein the gate driver is partly built in Silicon and partly built in GaN.

FIG. 6 illustrates a schematic diagram of an additional example of a gate driver and main power device wherein the gate driver is partly built in Silicon and partly built in GaN. The main power device Q15 in this embodiment is built in GaN. In the example illustrated in FIG. 6, the part of the gate driver built in Silicon is a CMOS inverter (Q13, Q14) and a high side device Q12, where the high side device is an npn transistor. In this example, the npn transistor is driven by the input signal of the gate driver. The input signal of the gate driver may be a signal from a controller such as PWM signal or another pulsed signal. The part of the gate driver built in GaN is a low side device Q16, where the low side device in this example is a GaN HEMT. The gate signal of the low side device GaN HEMT is the output of the CMOS inverter.

Figure 7A:
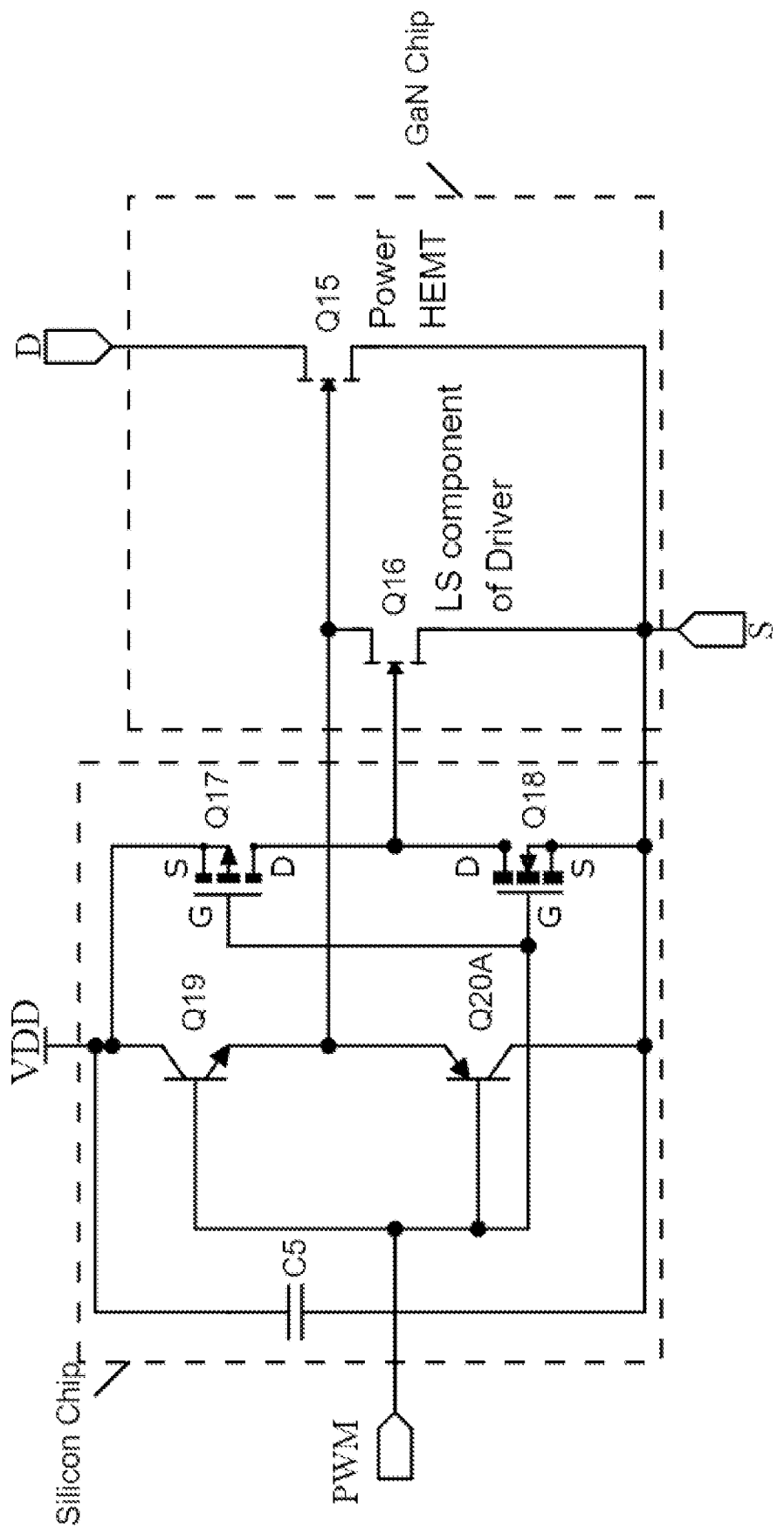
FIG. 7a illustratively shows a schematic diagram of an additional example of a gate driver and main power device according to the present disclosure wherein the gate driver is partly built in Silicon and partly built in GaN.

FIG. 7a illustrates a schematic diagram of an additional example of a gate driver and main power device Q15 wherein the gate driver is partly built in Silicon and partly built in GaN. In this example, the gate driver in Silicon comprises a Totem Pole driver (Q19, Q20A) as illustrated in FIG. 1, and additionally comprises a CMOS inverter (Q17, Q18). The Totem pole driver (Q19, Q20A) output is connected to the gate of the power device Q15, optionally through a resistor (not illustrated here). The output of the Si CMOS inverter (Q17, Q18) is used to drive a low side GaN device Q16. In this example, the low side of the Totem Pole driver is configured to be in parallel with the at least one low-side GaN component Q16. Its role is to aid the discharging of the input capacitance during the turn-off and thus providing a parallel path for the transient current flow during the turn-off off the main power device Q15. This is achieved while maintaining the advantages of the n-channel low-side component Q16 in GaN (HEMT) being placed very close to the main power device Q15 (i.e. on chip) thus cutting undesirable parasitics (especially inductances) between its drain terminal and the gate of the main power device.

Figure 7B:
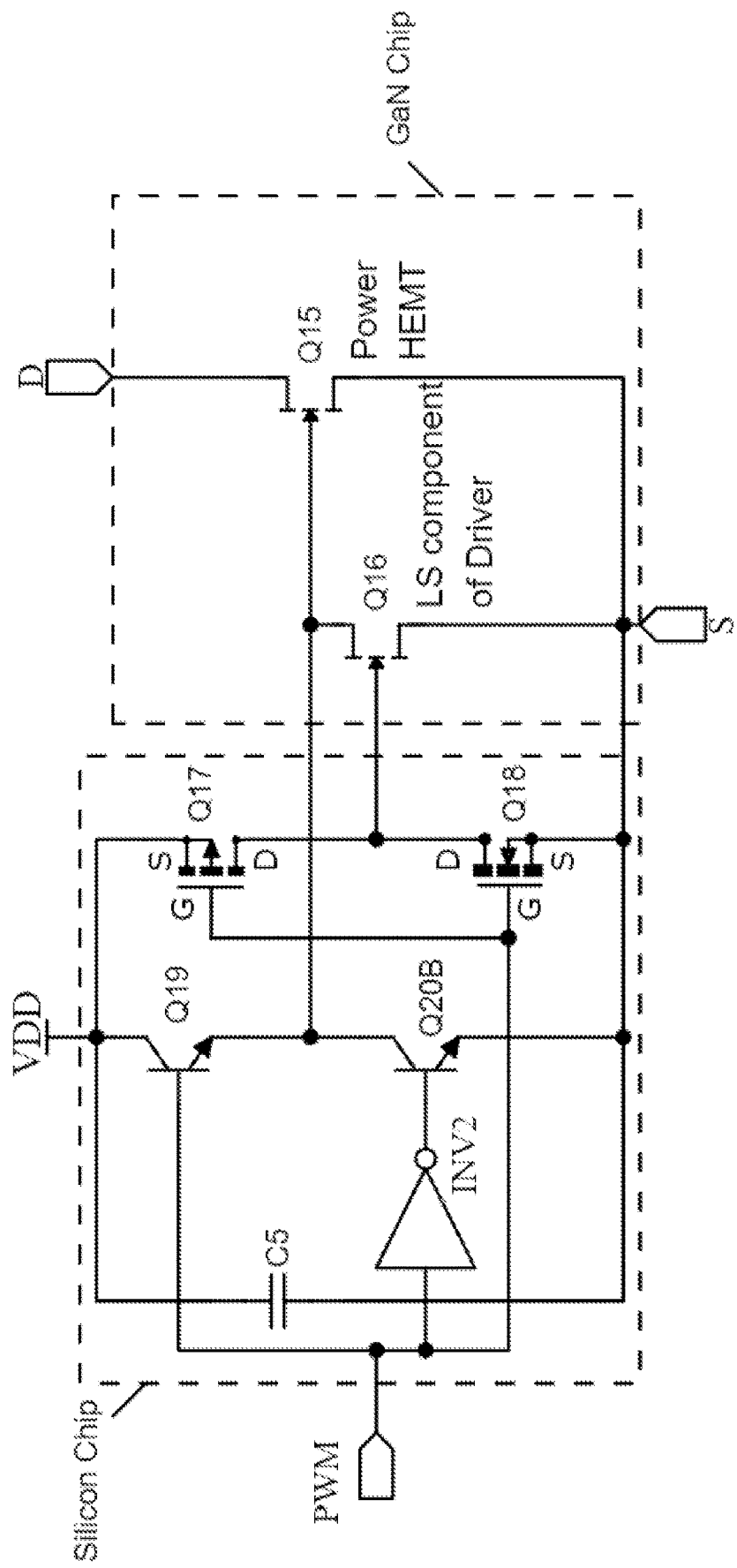
FIG. 7b illustratively shows a schematic diagram of an additional example of a gate driver and main power device according to the present disclosure wherein the gate driver is partly built in Silicon and partly built in GaN.

FIG. 7b illustrates a schematic diagram of an additional example of a gate driver and main power device Q15 wherein the gate driver is partly built in Silicon and partly built in GaN. FIG. 7b is similar to the example illustrated in FIG. 7a, however in this example the PNP transistor Q20A is replaced by an inverter INV2 and an NPN transistor Q20B.

Figure 8:
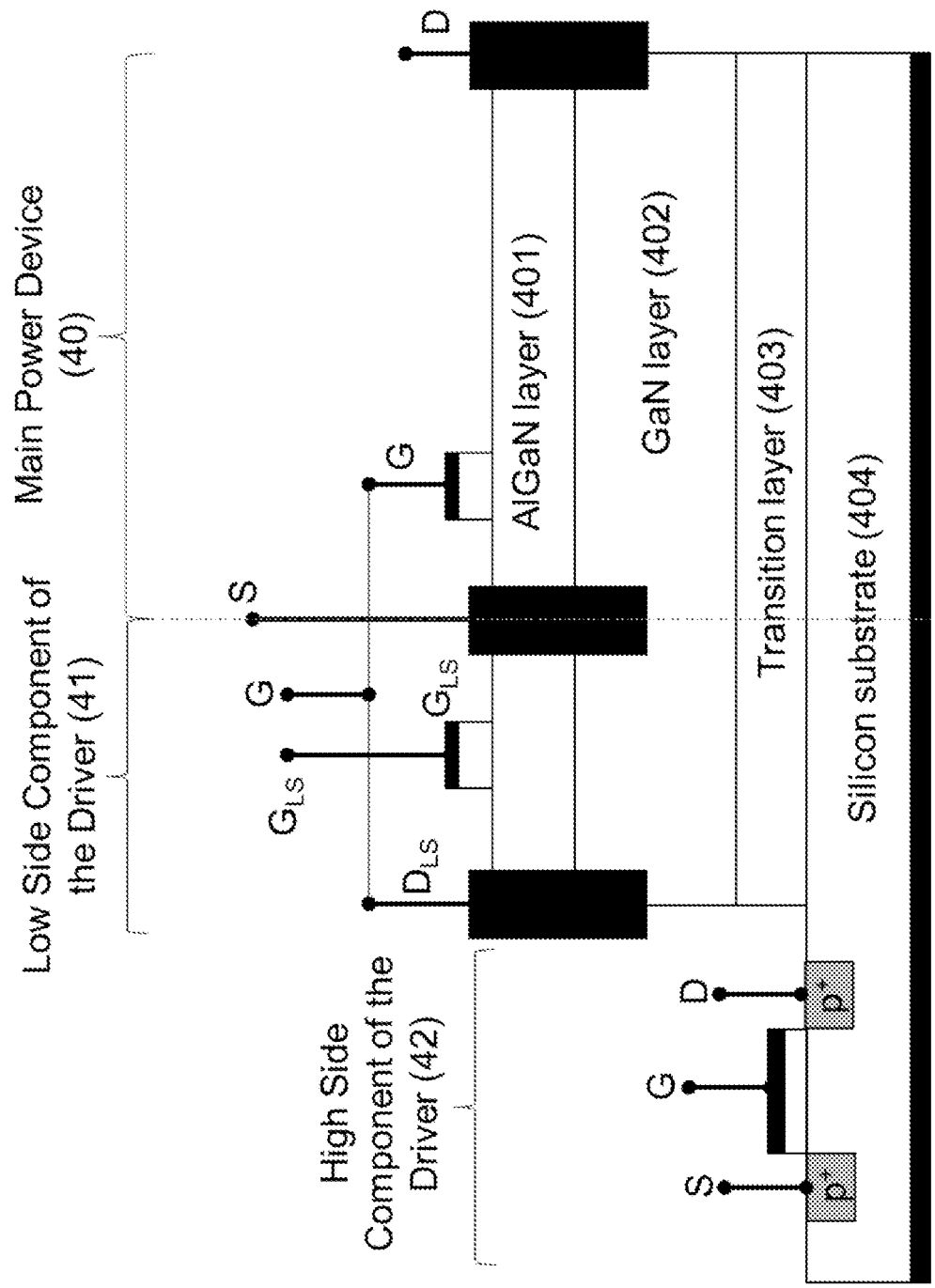
FIG. 8 illustratively shows a schematic cross section of an example of the components built in GaN and Silicon on the same wafer according to the present disclosure.

FIG. 8 illustrates a schematic cross section of an example of the components built in GaN and Silicon on the same wafer (i.e. monolithically integrated whereby both the driver and the GaN device are in thermal equilibrium). The cross section illustrates a substrate and an epitaxial stack which comprises a Silicon substrate 404, a transition layer 403, a GaN layer 402 and an AlGaN layer 401. Two devices are built on this material, one is the main power HEMT 40 and the other is the low side of the gate driver 41. Both devices are three terminal devices comprising a drain contact, a source contact and a gate contact. Both devices illustrated comprise a p-GaN gate. The cross section additionally includes a high side component 42 of the driver built on the silicon substrate 404 by accessing the substrate using conventional techniques. In this example this high side component comprises a p-channel MOS transistor.

Figure 9:
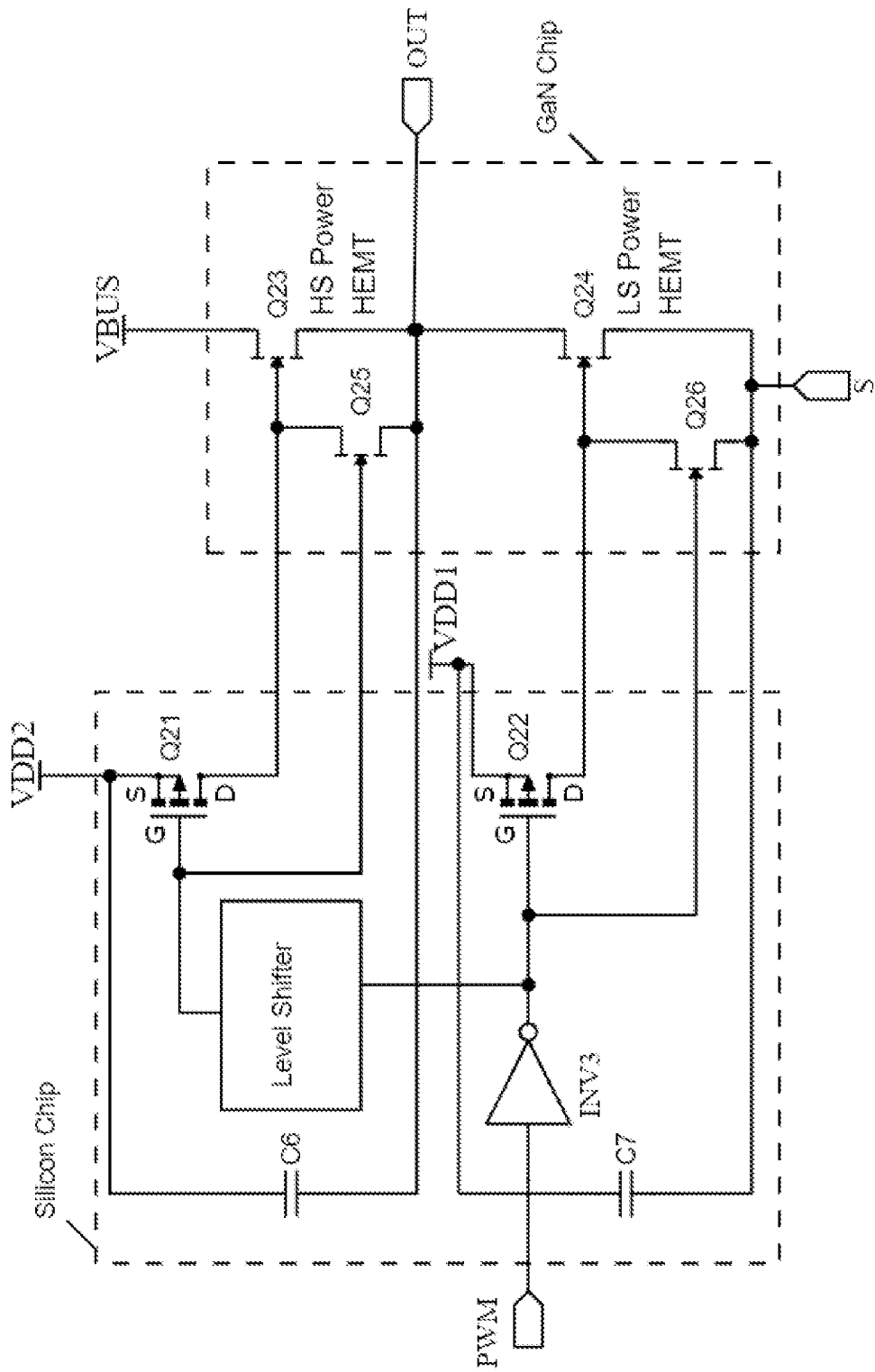
FIG. 9 illustratively shows a schematic diagram of an additional example of the present disclosure where the gate driver and main power transistor combinations may be used in a half bridge configuration.

FIG. 9 illustrates a schematic diagram of an additional example where the gate driver and main power transistor combinations illustrated in previous examples may be used in a half bridge configuration. There are two pairs of devices associated with the gate driver. Each pair comprises a low side and a high side devices. There are two as there are two power devices in half bridge configuration. Main power device Q24 may be used as the half bridge low side device, and main power device Q23 may be used as the half bridge high side device. The gate driver of the half bridge low side device may receive a PWM signal (or another pulsed signal) from a low side controller. The PWM signal may be inverted as illustrated. The gate driver of the half bridge low side device in the example illustrated in FIG. 9 comprises a first pair of devices Q22 and Q26. The gate driver of the high side device may also receive a signal from the low side controller but the signal needs to be level shifted using a level shifter. The gate driver of the half bridge high side device in the example illustrated in FIG. 9 comprises a second pair of devices Q21 and Q25.

The level shifter could also be part of the Silicon companion chip as illustrated in FIG. 9 or some elements of it could be placed in the silicon chip and other elements could be placed in the GaN chip (not illustrated here).

Figure 10:
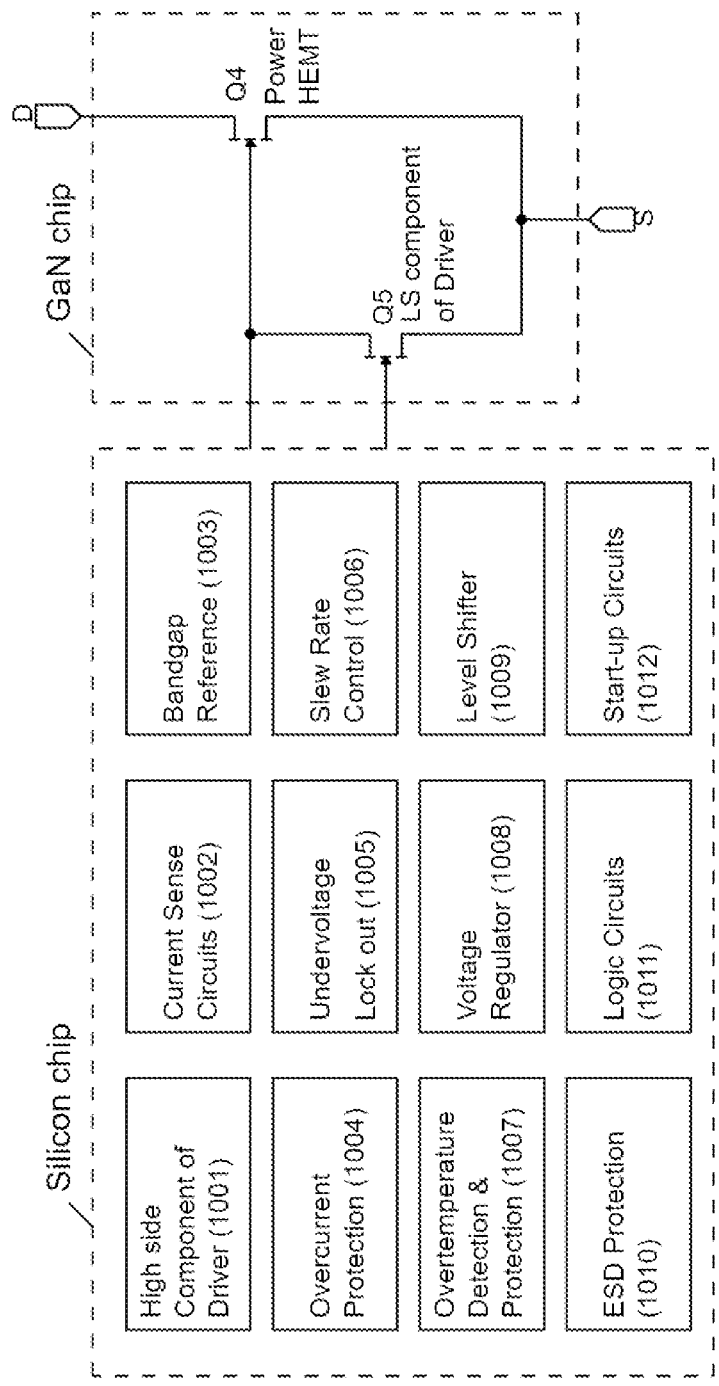
FIG. 10 illustratively shows an exemplary block diagram of the companion silicon chip with the GaN chip of FIG. 3 according to the present disclosure.

FIG. 10 illustrates an exemplary block diagram of the companion silicon chip with the GaN chip of FIG. 3. In addition to the high side component of gate driver 1001, the silicon companion chip could be leveraged to include a selection of control and protection circuits to benefit in terms of speed, power dissipation, design flexibility, yield etc. due to the maturity of Silicon technology compared to GaN technology in particular in regard to the availability of p-channel devices. The control and protection circuits include, but are not limited to current sense circuits, bandgap reference, overcurrent protection, undervoltage lockout (UVLO), slew rate control, overtemperature detection and protection, voltage regulator, level shifter, ESD protection, logic circuits, start-up circuits and/or any other control and protection circuits.

Figure 11:
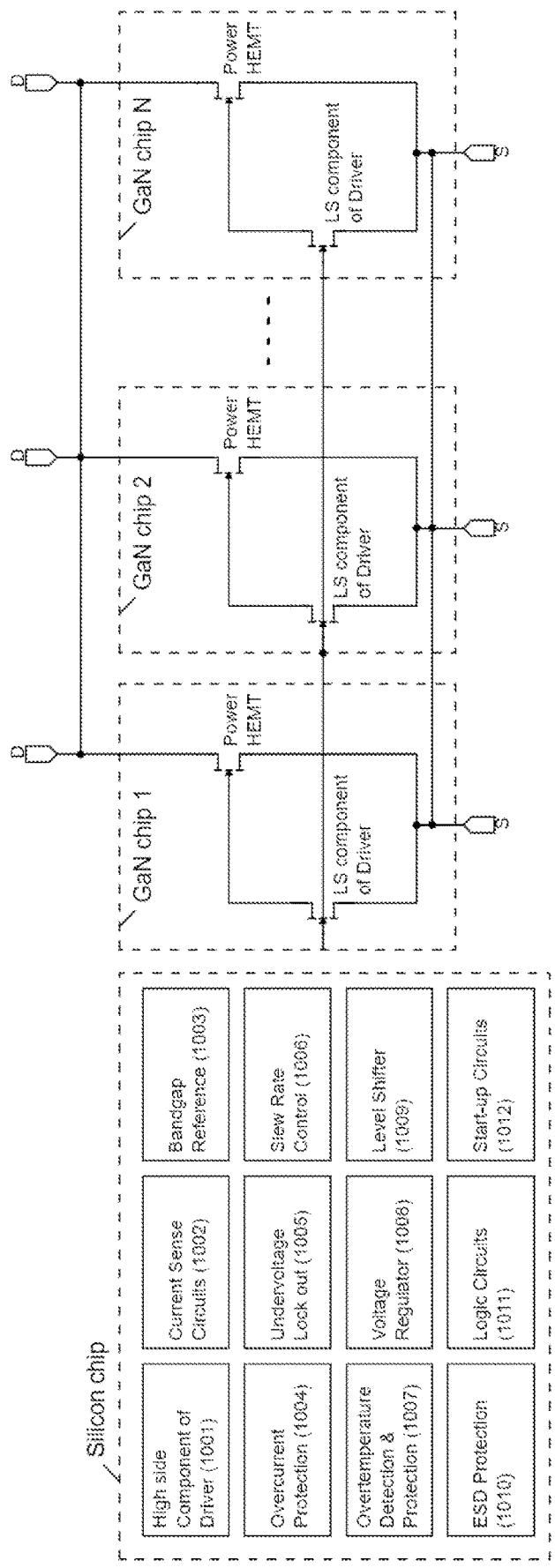
FIG. 11 illustratively shows multiple GaN chips of the present disclosure connected in parallel with one silicon companion chip.

FIG. 11 illustrates another aspect of the invention wherein multiple GaN chips (GaN chip 1, GaN chip 2, . . . . GaN chip N) are connected in parallel with one Silicon companion chip. Each GaN chip comprises a main power device and associated low side component of the driver while the high side component of the driver is provided in the silicon chip. In addition, the silicon chip comprises a selection of control and protection circuits similar to FIG. 10.

The skilled person will understand that in the preceding description and appended claims, positional terms such as 'top', 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the spirit and scope of the disclosure.

For example, the term low-power as used herein may refer a typical output power of a controller which is insufficient on its own to drive a gate. Conversely, high-power is a typical output power of a driver and is sufficient to drive a gate.

The invention claimed is:

1. A power integrated circuit comprising:
   a heterojunction structure Gallium Nitride, GaN, chip comprising at least one GaN layer and at least one Aluminium Gallium Nitride, AlGaN, layer wherein the GaN chip comprises at least one main power device comprising a source terminal, a drain terminal, a gate terminal and a two-dimensional electron gas, 2DEG, formed at an interface between the AlGaN and GaN layers and between the source and drain terminals, wherein the gate terminal is configured to modulate at least a portion of the 2DEG when a charge is applied to the gate terminal;
   a driver comprising at least one low-side component and at least one high-side component, wherein the low-side component comprises a terminal connected to a low DC voltage rail and at least one other terminal connected to the gate terminal of the main power device; wherein the high-side component comprises at least one terminal connected to a high DC voltage rail and at least one other terminal connected to the gate of the main power device;
   wherein the at least one low-side component of the driver is configured to discharge an input capacitance of the main power device during a turn-off of the main power device and is monolithically integrated within the GaN chip;
   wherein the at least one high-side component of the driver is configured to charge up the input capacitance of the main power device and is formed in a semiconductor region comprising a material other than GaN; and
   wherein the at least one high-side component of the driver is provided in a first semiconductor material, the at least one low-side component of the driver is provided in a second semiconductor material, and wherein the first semiconductor material and the second semiconductor material are different semiconductor materials.

2. A power integrated circuit according to claim 1, wherein the at least one other terminal of the high-side component connected to the gate of the main power device is connected indirectly to the gate of the main power device through a diode and/or a resistor.

3. A power integrated circuit according to claim 1, wherein the main power device and/or the low-side component of the driver is a High Electron Mobility Transistor (HEMT), and wherein the main power device has a higher power output and a higher blocking voltage than the low-side component of the driver.

4. A power integrated circuit according to claim 1, wherein the main power device and/or the low-side component of the driver comprises a plurality of 2DEG channels arranged in parallel between the source and drain terminals of the main power device.

5. A power integrated circuit according to claim 4, wherein the low-side component of the driver is configured to provide an increased resistance when the low-side component of the driver is in an OFF state and a reduced resistance when the low-side component of the driver is in an ON-state.

6. A power integrated circuit according to claim 1, wherein the low-side component of the driver comprises one of: a HEMT, MOSFET or MISFET, operative as a Miller clamp with a drain terminal connected to the gate terminal of the main power device and a source connected to the source of the main power device, and
 wherein the low-side component can be arranged proximal to the main power device or within a structure of the main power device.

7. A power integrated circuit according to claim 6, wherein the low-side component of the driver comprises said HEMT, the HEMT comprises multiple p+ GaN islands displaced in a direction perpendicular to the current flow between the source and drain terminals of said HEMT and wherein all the p+ multiple GaN islands are connected to the gate terminal of the said HEMT.

8. A power integrated circuit according to claim 1, wherein the at least low-side component of the driver comprises a normally-on or normally-off transistor or a parallel combination of a normally-on and normally-off transistor.

9. A power integrated circuit according to claim 1, wherein the GaN chip comprises one or more further 2DEG low-power transistors connected to the main power device or the low-side component of the driver.

10. A power integrated circuit according to claim 1, wherein the at least one high-side component of the driver is configured as a hole conduction component and/or is a p-channel MOSFET and/or is a bipolar NPN transistor.

11. A power integrated circuit according to claim 1, wherein the at least one high-side component of the driver and the at least one low-side component of the driver operate as a CMOS cell.

12. A power integrated circuit according to claim 1 wherein a further low-side component of the driver is arranged in parallel with the at least one low-side component of the driver and provided in the semiconductor region comprising a material other than GaN.

13. A power integrated circuit according to claim 12, wherein the further low-side component of the driver comprises an n-channel MOSFET, an n-channel JFET, a PNP bipolar transistor or an NPN transistor with an additional inverter placed on a base terminal of the NPN transistor.

14. A power integrated circuit according to claim 1, wherein the GaN chip comprises one or more current sensing devices or high voltage current sensing switches configured for current sensing.

15. A power integrated circuit according to claim 1, wherein the semiconductor region comprising a material other than GaN is formed on a semiconductor substrate and positioned below or adjacent and below a heterojunction interface of the GaN chip, and wherein the substrate comprises a silicon or silicon carbide material.

16. A power integrated circuit comprising:
 at least one heterojunction structure Gallium Nitride, GaN, chip comprising at least one GaN layer and at least one Aluminium Gallium Nitride, AlGaN, layer wherein the GaN chip comprises at least one main power device comprising a source terminal, a drain terminal, a gate terminal, and a two-dimensional electron gas, 2DEG, formed at an interface between the AlGaN and GaN layers and between the source and drain terminals, wherein the gate terminal is configured to modulate at least a portion of the 2DEG when a charge is applied to the gate terminal;
 a half bridge circuit comprising a low-side main power device formed in the at least one GaN chip, a high-side main power device formed in the at least one GaN chip or in a further GaN chip;
 a driver containing a first pair and a second pair, each pair comprising at least one low-side component and at least one high side component, wherein the first pair is configured to charge and discharge the input capacitance of the low-side main power device during the turn-on and turn-off of the low-side main power device, and wherein the second pair is configured to charge and discharge the input capacitance of the high-side main power device during the turn-on and turn-off of the low-side main power device;
 wherein the driver further comprises a level shifter configured to shift the low voltage control of the first pair to a high voltage control of the second pair,
 wherein each of the at least one low-side component of the driver is formed in the GaN chip or in the further GaN chip; and
 wherein each of the at least one high-side component of the driver are formed in a semiconductor region comprising a material other than GaN.

17. A power integrated circuit comprising:
 a plurality of heterojunction structure Gallium Nitride, GaN, chips each comprising at least one, GaN, layer and at least one Aluminium Gallium Nitride, AlGaN, layer wherein each of the GaN chips comprises at least one main power device comprising a source terminal, a drain terminal, a gate terminal and a two-dimensional electron gas, 2DEG, formed at an interface between the AlGaN and GaN layers and between the source and drain terminals, wherein the gate terminal is configured to modulate at least a portion of the 2DEG when a charge is applied to the gate terminal,
 wherein each of the GaN chips comprises a low-side component of a driver;
 wherein the main power devices of the plurality of GaN chips are connected in parallel; and
 a single silicon companion chip comprising at least one high-side component of the driver, wherein the at least one-high side component of the driver is connected to the drain terminals of the low-side components of the main power devices of the plurality of GaN chips and is further connected to the gate terminals of the main power devices of the plurality of GaN chips.

18. A power integrated circuit according to claim 17 wherein the semiconductor region comprising a material other than GaN comprises a silicon companion chip configured for one of: CMOS operation, high voltage CMOS operation, bipolar CMOS operation, bipolar CMOS operation, DMOS (BCD) operation.

19. A power integrated circuit according to claim 17 wherein the single silicon companion chip comprises one or more of:
 a level shifter;
 a logic circuit;
 a voltage regulator;
 a start-up circuits;
 a bandgap reference;
 current sensing, current amplifier or transconductance circuits;
 temperature sensing;
 an over-current and an over-temperature protection circuit;

a memory storage;
an under-voltage lock-out circuit;
a slew rate control circuit;
an electrostatic discharge, ESD, protection device; and
a PWM controller.

* * * * *